(12) United States Patent
Kim et al.

(10) Patent No.: US 8,547,747 B2
(45) Date of Patent: Oct. 1, 2013

(54) NON-VOLATILE MEMORY DEVICE

(75) Inventors: Su-Kyoung Kim, Suwon-si (KR);
Gil-Heyun Choi, Seoul (KR);
Jong-Myeong Lee, Seongnam-si (KR);
In-Sun Park, Seoul (KR); Ji-Soon Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 63 days.

(21) Appl. No.: 13/191,581

(22) Filed: Jul. 27, 2011

(65) Prior Publication Data
US 2012/0120728 A1    May 17, 2012

(30) Foreign Application Priority Data
Nov. 16, 2010  (KR) .................... 10-2010-0113929

(51) Int. Cl.
*G11C 16/04*    (2006.01)

(52) U.S. Cl.
USPC ............. 365/185.18; 365/185.26; 365/185.27

(58) Field of Classification Search
USPC ................... 365/185.18, 185.26, 185.27
See application file for complete search history.

(56) References Cited

U.S. PATENT DOCUMENTS

| | | | | |
|---|---|---|---|---|
| 6,677,204 B2* | 1/2004 | Cleeves et al. | ................ | 438/268 |
| 7,956,407 B2* | 6/2011 | Son et al. | ................ | 257/324 |
| 7,960,780 B2* | 6/2011 | Son et al. | ................ | 257/329 |
| 8,053,829 B2* | 11/2011 | Kang et al. | ................ | 257/326 |
| 8,063,438 B2* | 11/2011 | Son et al. | ................ | 257/328 |

FOREIGN PATENT DOCUMENTS

| | | |
|---|---|---|
| JP | 2010-040122 | 2/2010 |
| JP | 2010-067745 | 3/2010 |
| KR | 1020090047614 | 5/2009 |

* cited by examiner

*Primary Examiner* — Pho M Luu
(74) *Attorney, Agent, or Firm* — Stanzione & Kim, LLP

(57) ABSTRACT

A non-volatile memory device is provided, including a substrate formed of a single crystalline semiconductor, pillar-shaped semiconductor patterns extending perpendicular to the substrate, a plurality of gate electrodes and a plurality of interlayer dielectric layers alternately stacked perpendicular to the substrate, and a charge spread blocking layer formed between the plurality of gate electrodes and the plurality of interlayer dielectric layers.

19 Claims, 14 Drawing Sheets

NON-VOLATILE MEMORY DEVICE

CROSS-REFERENCE TO RELATED APPLICATIONS

This application claims priority under 35 U.S.C. §119 from Korean Patent Application No. 10-2010-0113929 filed on Nov. 16, 2010 in the Korean Intellectual Property Office, the disclosure of which is incorporated herein by reference in its entirety.

BACKGROUND

1. Field of the General Inventive Concept

The present general inventive concept relates to a non-volatile memory device.

2. Description of the Related Art

In order to satisfy consumer requirements, including, for example, high performance and low cost, there is growing demand for high density semiconductor memory device in the development of semiconductor fabrication techniques. Since the integration density of a semiconductor memory device is important factor in pricing the semiconductor memory device, increased integration density is particularly required. In a conventional two-dimensional (2D) or planar semiconductor memory device, the integration density is mainly determined by an area occupied by a unit memory cell. Thus, the conventional 2D semiconductor memory device is greatly affected by micro-patterning technologies.

However, very expensive equipments are required to achieve micro-patterning, the conventional 2D semiconductor memory device still has limitation in increasing the integration density.

In order to overcome the limitation, a vertical cell string structure is being researched, in which memory cells are formed in a three-dimensional manner.

In the vertically stacked non-volatile memory device, it is necessary to prevent leakage of charges stored in a charge storage layer and to improve the reliability of the memory device.

SUMMARY

The present general inventive concept provides a non-volatile memory device having improved reliability.

Additional features and utilities of the present general inventive concept will be set forth in part in the description which follows and, in part, will be obvious from the description, or may be learned by practice of the general inventive concept.

The above and other objects of the present general inventive concept will be described in or be apparent from the following description of the preferred embodiments.

The foregoing and/or other aspects and utilities of the present general inventive concept may be achieved by providing a non-volatile memory device is provided, including a substrate formed of a single crystalline semiconductor, pillar-shaped semiconductor patterns extending perpendicular to the substrate, a plurality of gate electrodes and a plurality of interlayer dielectric layers alternately stacked perpendicular to the substrate, and a charge spread blocking layer formed between the plurality of gate electrodes and the plurality of interlayer dielectric layers.

The foregoing and/or other aspects and utilities of the present general inventive concept may also be achieved by providing a non-volatile memory device including a substrate formed of a single crystalline semiconductor, pillar-shaped semiconductor patterns extending perpendicular to the substrate, charge storage layer formed on the entire surface of sidewalls of the semiconductor patterns, a plurality of gate electrodes stacked perpendicular to the substrate, a plurality of interlayer dielectric layers alternately stacked, and a charge spread blocking layer extending perpendicular to the charge storage layer.

The foregoing and/or other aspects and utilities of the present general inventive concept may be achieved by providing a non-volatile memory device including a plurality of memory cells on a semiconductor substrate, the memory cells including a plurality of gate electrodes connected in series and stacked perpendicular to the substrate, a plurality of pillar-shaped semiconductor patterns disposed adjacent to and extending along the stack gate electrodes, a charge storage layer positioned between the gate electrodes and the pillar-shaped semiconductor patterns to receive charges from the semiconductor patterns when voltage is applied to a gate electrode.

The plurality of gate electrodes may include an upper select gate electrode, a lower select gate electrode, and a plurality of control gate electrodes.

The foregoing and/or other aspects and utilities of the present general inventive concept may also be achieved by forming a semiconductor device, including forming impurity regions of a first conductivity type in a semiconductor substrate, alternatively stacking a plurality of interlayer dielectric layers and sacrificial dielectric layers in a direction perpendicular to the surface of the substrate, forming a charge spread blocking layer on upper and lower surfaces of each of the sacrificial dielectric layers, patterning and forming first pillar-shaped openings directly above the impurity regions to extend through the interlayer dielectric layers and sacrificial dielectric layers, forming a plurality of charge storage layers on sides of the pillar-shaped openings, forming pillar-shaped semiconductor patterns in the pillar-shaped openings, removing the sacrificial dielectric layers to form grooves and filling the grooves with conductive material to form vertically stacked gate electrode patterns.

The method may include forming a second pillar-shaped opening between the plurality of impurity regions and first pillar-shaped semiconductor patterns to extend through the interlayer dielectric layers and sacrificial dielectric layers, depositing the conductive material in the second pillar-shaped opening to form additional vertically stacked gate electrodes, and filling the second pillar-shaped opening will an insulating material to isolate a first vertically stacked gate electrode pattern from a second vertically stacked gate electrode pattern.

The method may include forming a tunnel insulating layer between the charge storage layers and the semiconductor patterns, and forming a capping insulating layer between the charge storage layers and the gate electrodes.

The capping layers may have a higher dielectric constant than the tunnel insulation layers and the charge storage layers may have a higher dielectric constant than the capping layers.

The foregoing and/or other aspects and utilities of the present general inventive concept may also be achieved by providing method of programming a memory cell having a plurality of memory transistors including a plurality of vertically stacked gate electrodes, a pillar-shaped semiconductor pattern extending along the vertically stacked gate electrodes and a charge storage layer positioned between the gate electrodes and the semiconductor pattern, the method including applying a programming voltage to a selected gate electrode word line to inject electrons from the semiconductor pattern into the charge storage layer of the plurality of memory transistors.

BRIEF DESCRIPTION OF THE DRAWINGS

These and/or other features and utilities of the present general inventive concept become more apparent and more readily appreciated by describing exemplary embodiments of the present general inventive concept with reference to the attached drawings in which.

DETAILED DESCRIPTION OF THE PREFERRED EMBODIMENTS

Figure 1:
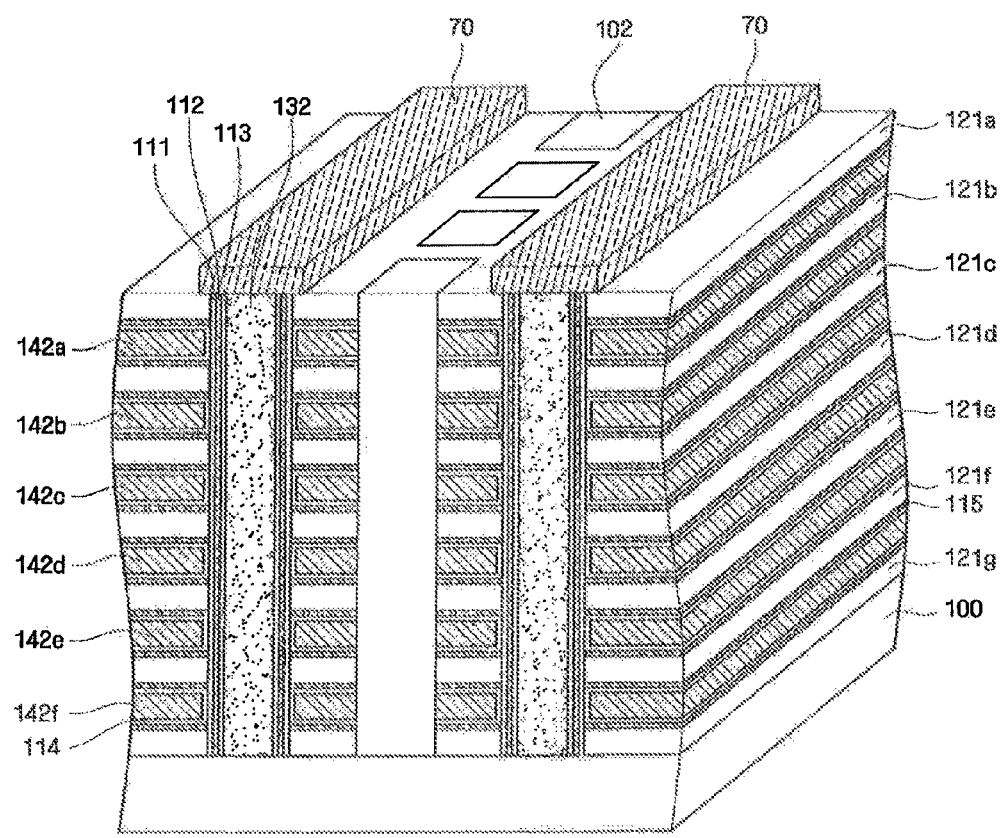
FIG. 1 is a perspective view illustrating a non-volatile memory device according to an embodiment of the present general inventive concept.

The present general inventive concept will now be described more fully hereinafter with reference to the accompanying drawings, in which preferred embodiments of the general inventive concept are illustrated. This general inventive concept may, however, be embodied in different forms and should not be construed as limited to the embodiments set forth herein. Rather, these embodiments are provided so that this disclosure will be thorough and complete, and will fully convey the scope of the general inventive concept to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the general inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this general inventive concept belongs. It is noted that the use of any and all examples, or exemplary terms provided herein is intended merely to better illuminate the general inventive concept and is not a limitation on the scope of the general inventive concept unless otherwise specified. Further, unless defined otherwise, all terms defined in generally used dictionaries may not be overly interpreted.

The present general inventive concept will be described with reference to perspective views, cross-sectional views, and/or plan views, in which preferred embodiments of the general inventive concept are illustrated. Thus, the profile of an exemplary view may be modified according to manufacturing techniques and/or allowances. That is, the embodiments of the general inventive concept are not intended to limit the scope of the present general inventive concept but cover all changes and modifications that can be caused due to a change in manufacturing process. Thus, regions illustrated in the drawings are illustrated in schematic form and the shapes of the regions are presented simply by way of illustration and not as a limitation.

Figure 2:
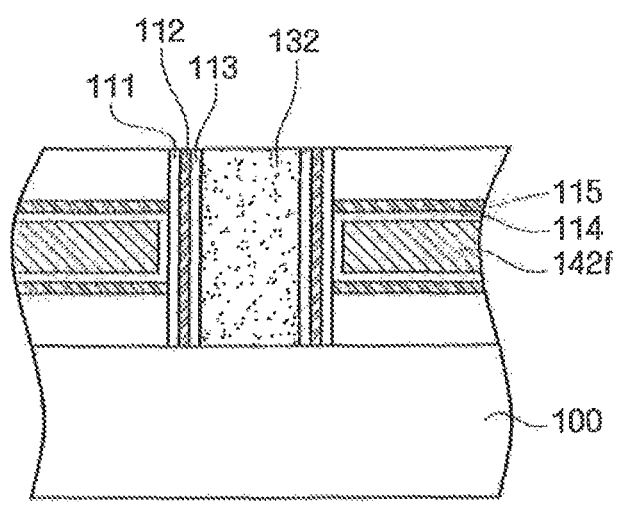
FIG. 2 is a cross-sectional view illustrating one cell transistor in the non-volatile memory device illustrated in FIG. 1.
Figure 3:
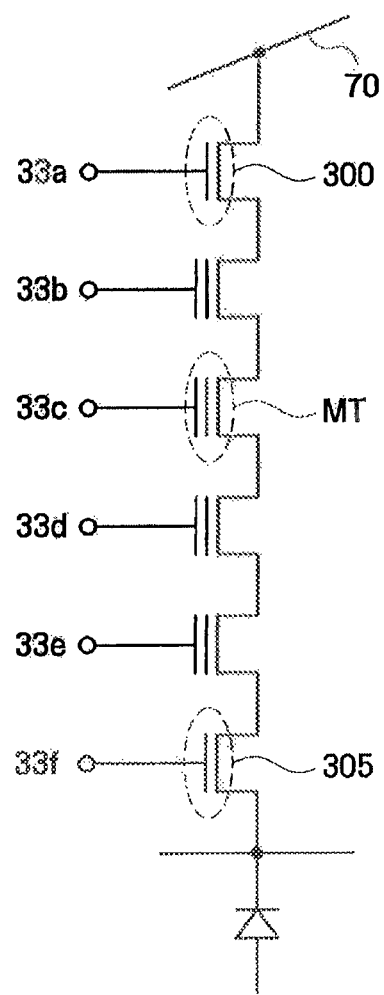
FIG. 3 is a circuit diagram illustrating a memory cell string included in the non-volatile memory device illustrated in FIG. 1.

Hereinafter, a non-volatile memory device according to an embodiment of the present general inventive concept will be described with reference to FIGS. 1 to 3. FIG. 1 is a perspective view illustrating a non-volatile memory device according to an embodiment of the present general inventive concept. FIG. 2 is a cross-sectional view illustrating one cell transistor in the non-volatile memory device illustrated in FIG. 1, and FIG. 3 is a circuit diagram illustrating a memory cell string included in the non-volatile memory device illustrated in FIG. 1. The non-volatile memory device according to an embodiment of the present general inventive concept is a vertical NAND flash memory device.

Referring to FIGS. 1 and 2, a substrate 100 made of a single crystalline semiconductor material is provided. The substrate 100 may include, for example, single crystalline silicon.

Pillar-shaped semiconductor patterns extending perpendicular to the substrate may be formed on the substrate 100. The semiconductor patterns 132 may be disposed on the substrate 100 so as to be arranged regularly. For example, the semiconductor patterns 132 may be regularly arranged at constant intervals in a first direction and a second direction perpendicular to the first direction.

The semiconductor patterns 132 may be made of, for example, single crystalline silicon. The semiconductor patterns 132 may be formed by forming amorphous silicon and applying heat thereto to change the phase of the amorphous silicon into single crystalline silicon. Alternatively, the semiconductor patterns 132 may be formed by performing epitaxial growth using the substrate 100 as a seed.

A plurality of cell transistors forming a single cell string may be formed in the semiconductor patterns 132. The cell transistors may be serially connected to each other in a vertical direction. In general, $2^m$ cell transistors (m is a natural number greater than or equal to 1) may be formed in one cell string formed on the substrate 100.

In the non-volatile memory device according to the embodiment of the present general inventive concept, if the number of cell transistors included in a memory cell string increases, a stack height of the cell transistors may also increase. In the following description, it is assumed that one memory cell string includes 6 cell transistors serially connected to each other.

The memory cell string may include a plurality of gate electrodes 142a-142f forming cell transistors. Among the plurality of gate electrodes 142a-142f, the bottommost gate electrode 142f may be used as a lower select gate, the topmost gate electrode 142a may be used as an upper select gate, and the middle gate electrodes 142b-142e may be used as control gates, respectively.

The plurality of gate electrodes 142a-142f may have horizontal plate shapes. Here, the semiconductor patterns 132 may vertically extend through the plurality of gate electrodes 142a-142f. A drain (not illustrated) and a source (not illustrated) may be disposed on top and bottom ends of the semiconductor patterns 132.

Bit lines 70 may be directly electrically connected to the semiconductor patterns 132. Alternatively, the bit lines 70 and the semiconductor patterns 132 may be electrically connected to each other using plugs. The plurality of gate electrodes 142a-142f may be made of a conductive material such as tungsten (W), cobalt (Co), or nickel (Ni), or silicon, but not limited thereto.

The plurality of gate electrodes 142a-142f may have the same thickness or different thicknesses. Since a thickness of each of the plurality of gate electrodes 142a-142f determines a channel length, the thickness can be arbitrarily selected within the range in which problems with electrical characteristics due to a short channel effect can be solved.

Although not illustrated, the non-volatile memory device may further include peripheral areas including peripheral circuits operating the memory cell string. The peripheral circuits may include, for example, an upper select line driving circuit electrically connected to the upper select gate 142a, word line driving circuits electrically connected to the plurality of control gates 142b-142e, and a lower select line driving circuit electrically connected to the lower select gate 142f.

Interlayer dielectric layer patterns 121a-121g are formed between the gate electrodes 142a-142f stacked perpendicular to the substrate 100. The interlayer dielectric layer patterns 121a-121g insulate the gate electrodes 142a-142f positioned on the respective layers from each other. The interlayer dielectric layer patterns 121a-121g may be formed of a silicon oxide layer or a silicon nitride layer.

A tunnel insulation layer 113, a charge storage layer 112, and a capping layer 111 may be sequentially stacked on the entire surface of both sidewalls of the semiconductor patterns 132.

The tunnel insulation layer 113 may be formed of a silicon oxide layer or a dual layer including a silicon oxide layer and a silicon nitride layer.

The charge storage layer 112 may be formed of a nitride layer or a high-k layer. The nitride layer may include, for example, one or more selected from silicon nitride, silicon oxynitride, hafnium oxynitride, zirconium oxynitride, hafnium silicon oxynitride, and hafnium aluminum oxynitride. The high-k layer may include, for example, one or more selected from hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The charge storage layer 112 traps charges and stores information.

The capping layer 111 may include insulating metal oxide having a larger dielectric constant than the tunnel insulation layer 113. The capping layer 111 may include, for example, high-k material such as aluminum oxide, hafnium oxide, lanthanum oxide, tantalum oxide, titanium oxide, lanthanum hafnium oxide, lanthanum aluminum oxide, or dysprosium scandium oxide, or combinations of these high-k materials. The capping layer provides a barrier between the gate electrodes and the charge storing layer 112.

A charge spread blocking layer 115 is formed between each of the gate electrodes 142a-142f stacked perpendicular to the substrate 100 and each of the interlayer dielectric layer patterns 121a-121g. Since the charge storage layer 112 is formed perpendicular to a direction in which a channel is formed, charges are trapped to only regions of the charge storage layer 112, to which a gate bias is applied, at an initial program state. However, the charges may spread into regions to which a gate bias is not applied, with the passage of time. The charge spread blocking layer 115 may electrically prevent leakage of charges stored in the charge storage layer 112, thereby improving the reliability of the non-volatile memory device. The charge spread blocking layer 115 may be formed of a metal nitride layer having fixed charges. The charge spread blocking layer 115 may be made of, for example, aluminum nitride or aluminum oxynitride.

A blocking insulation layer 114 is formed between each of the gate electrodes 142a-142f stacked perpendicular to the substrate 100 and each of the charge spread blocking layer 115. The blocking insulation layer 114 may be formed of an aluminum oxide layer or a dual layer including an aluminum oxide layer and a silicon oxide layer. The blocking insulation layer 114 may be formed to surround surfaces of the gate electrodes 142a-142f.

Pillar-shaped insulation layer patterns 102 may be formed on the substrate 100.

Referring to FIG. 1 to FIG. 3, in a non-volatile memory device according to an embodiment of the present general inventive concept, program operation can be implemented by setting a voltage difference between a selected word line and the semiconductor patterns 132 and injecting charges into the charge storage layer 112. For example, a program voltage Vprog is applied to a selected word line, and electrons from the semiconductor patterns 132 are injected into the charge storage layer 112 of memory transistors (MT) 33b-33e belonging to a word line to be programmed using a Fowler-Nordheim tunneling phenomenon, thereby implementing programming. The program voltage Vprog applied to the selected word line allows memory transistors belonging to a non-selected word line to be programmed, thereby preventing unintended programming using boosting technology.

A read operation is performed such that zero (0) volt is set to a word line WL connected to the memory transistors (MTs) 33b-33e, and a read voltage Vread is set to another word line. As a result, it is determined whether current is charged to a bit line depending on whether a threshold voltage Vth of a to-be-read memory transistor among the memory transistors (MTs) 33b-33e is greater than 0 volt or not. Accordingly, data of the memory transistors (MTs) 33b-33e can be read by sensing the current of the bit line.

An erase operation may be performed using so-called "gate induced drain leakage (GIDL)" in units of blocks. For example, an erase voltage Verase is applied to a selected bit line and the substrate 100, thereby increasing the potential of the semiconductor patterns 132. Here, the potential of the semiconductor patterns 132 may increase with a slight delay.

Concomitantly, the GIDL is generated at a terminal of the bottommost select gate 142a and electrons generated by the GIDL are emitted to the substrate 100 while holes generated by the GIDL are emitted to the semiconductor patterns 132. Accordingly, a potential close to the erase voltage Verase may be transmitted to channels of the memory transistors (MTs) 33b-33e, that is, the semiconductor patterns 132. Here, if the potential of a word line is set to 0 volt, the electrons accumulating in the memory transistors (MTs) 33b-33e escape, thereby implementing the erase operation. Meanwhile, a word line of a non-selected block may be floated so as not to perform an unintended erase operation.

Next, a method of manufacturing the non-volatile memory device illustrated in FIG. 1 will be described with reference to FIGS. 1 to 12. FIGS. 4 to 12 are cross-sectional views illustrating intermediate process operations to explain a method of manufacturing the non-volatile memory device illustrated in FIG. 1. For brevity, the same functional components as those illustrated in FIGS. 1 to 3 are denoted by the same reference numerals and detailed descriptions thereof will be omitted.

Figure 4:
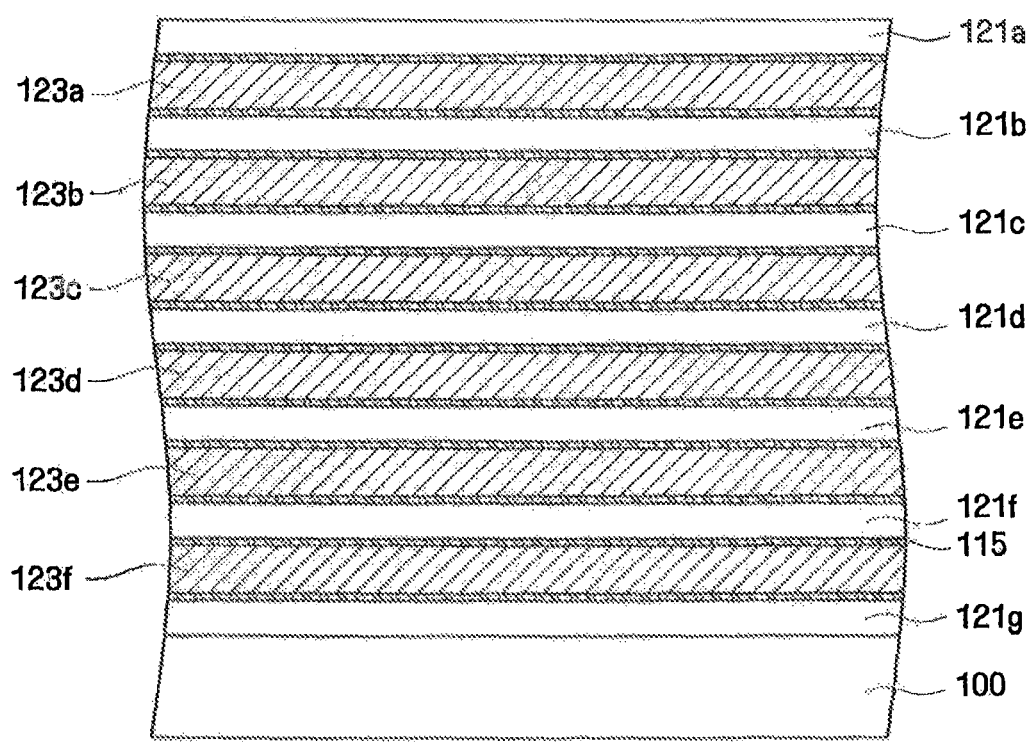
FIGS. 4 to 12 are cross-sectional views illustrating intermediate process operations to explain a method of manufacturing the non-volatile memory device illustrated in FIG. 1.

Referring to FIG. 4, a substrate 100 made of a single crystalline semiconductor material is provided. Impurity is doped into the substrate 100, thereby forming an impurity region (not illustrated) used as a source line (S/L) of the non-volatile memory device. Specifically, N-type impurity is doped into a portion of the substrate 100 where a cell block is formed. The substrate 100 is thermally oxidized, thereby forming a pad oxide layer on the substrate 100.

A plurality of interlayer dielectric layers 121a-121g and a plurality of sacrificial layers 123a-123f are alternately stacked on the substrate 100. Here, a charge spread blocking layer 115 is formed between the interlayer dielectric layers 121a-121g and the sacrificial layers 123a-123f. The interlayer dielectric layers 121a-121g, the sacrificial layers 123a-123f, and the charge spread blocking layer 115 may be formed by chemical vapor deposition.

Since the gate electrodes 142a~142f are formed on regions from which the sacrificial layers 123a-123f are removed. The number of layers of the interlayer dielectric layers 121a-121g and the sacrificial layers 123a-123f is equal to or greater than the number of cell transistors included in a memory cell string. For example, in a case where n cell transistors are connected to each other in a memory cell string in series, 1 to (n+1) layers of the sacrificial layers 123a-123f and 1 to (n+1) layers of the interlayer dielectric layers 121a-121g may be alternately stacked. In this embodiment, 6 cell transistors are connected in one memory cell string. Thus, as illustrated in FIG. 4, first to sixth layers of the sacrificial layers 123a-123f and first to seventh layers of the interlayer dielectric layers 121a-121g may be alternately stacked.

The sacrificial layers 123a-123f and the interlayer dielectric layers 121a-121g may be made of materials having different etch selectivities. Here, the etch selectivities of the sacrificial layers 123a-123f and the interlayer dielectric layers 121a-121g may be, for example, 10:1, but not limited thereto. The etch selectivities may be in a ratio range in which the interlayer dielectric layers 121a-121g can remain when the sacrificial layers 123a-123f are removed in a subsequent process. The sacrificial layers 123a-123f may be made of, for example, silicon oxide, and the interlayer dielectric layers 121a-121g may be made of, for example, silicon nitride, or vice versa.

While the sacrificial layers 123a-123f illustrated in the drawings have the same thickness, thicknesses of the sacrificial layers 123a-123f may be different for the respective layers. That is to say, the sacrificial layers 123a-123f are removed in a subsequent process and the gate electrodes 142a-142f of the cell transistors are formed in regions from which the sacrificial layers 123a-123f are removed. In some cases, it is necessary to vary channel lengths according to characteristics required for the cell transistors. Accordingly, thicknesses of the regions from which the sacrificial layers 123a-123f are removed can be adjusted by adjusting thicknesses of the sacrificial layers 123a-123f. In addition, since thicknesses of the gate electrodes 142a-142f of the cell transistors formed in the regions are also adjusted, it is possible to vary the channel lengths of the respective cell transistors.

The charge spread blocking layer 115 may be made of a material having different etch selectivity from the sacrificial layers 123a-123f. For example, the charge spread blocking layer 115 may be formed of a metal nitride layer. Specifically, the charge spread blocking layer 115 may be formed of, for example, an aluminum nitride layer or an aluminum oxynitride layer.

Figure 5:
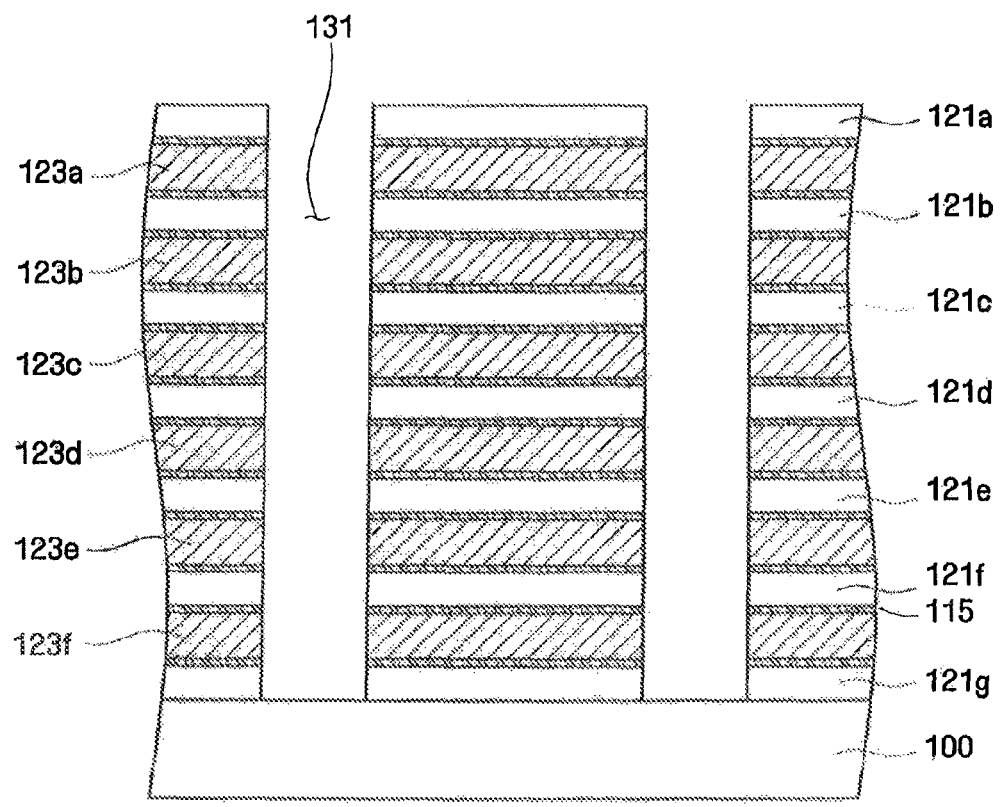

Next, referring to FIG. 5, holes 131 to form semiconductor patterns are formed on the resultant structure illustrated in FIG. 4. Here, the semiconductor pattern forming holes 131 may be formed to extend through the sacrificial layers 123a-123f, the interlayer dielectric layers 121a-121g, and the charge spread blocking layer 115.

Figure 6:
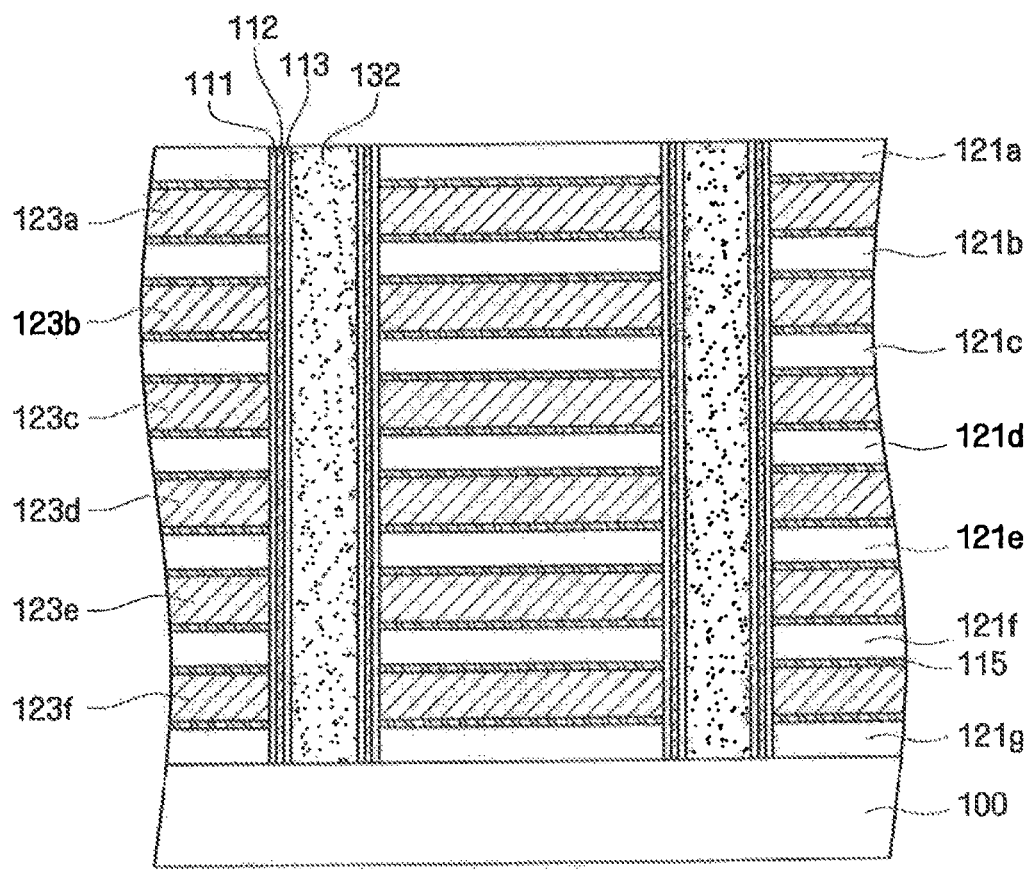

Next, referring to FIG. 6, a capping layer 111, a charge storage layer 112, and a tunnel insulation layer 113 are sequentially formed along both inner walls of the semiconductor pattern forming holes 131. The capping layer 111, the charge storage layer 112, and the tunnel insulation layer 113 may be formed by chemical vapor deposition or atomic layer deposition. The capping layer 111 may be made of an insulating metal oxide having a larger dielectric constant than the tunnel insulation layer 113. The charge storage layer 112 may be formed of a nitride layer or a high-k layer. The tunnel insulation layer 113 may be formed of a silicon oxide layer or a dual layer including a silicon oxide layer and a silicon nitride layer.

Next, semiconductor patterns 132 are formed in the semiconductor pattern forming holes 131 having the capping layer 111 the charge storage layer 112, and the tunnel insulation layer 113. The semiconductor patterns 132 may be shaped of pillars extending perpendicular to the substrate 100. The semiconductor patterns 132 may be made of, for example, single crystalline silicon. The semiconductor patterns 132 may be formed by forming amorphous silicon and applying heat thereto to change the phase of the amorphous silicon into single crystalline silicon. Alternatively, the semiconductor patterns 132 may be formed by performing epitaxial growth using the substrate 100 as a seed. Thereafter, a chemical mechanical polishing (CMP) process may be further performed to expose a top surface of the interlayer dielectric layer 121a if necessary.

Figure 7:
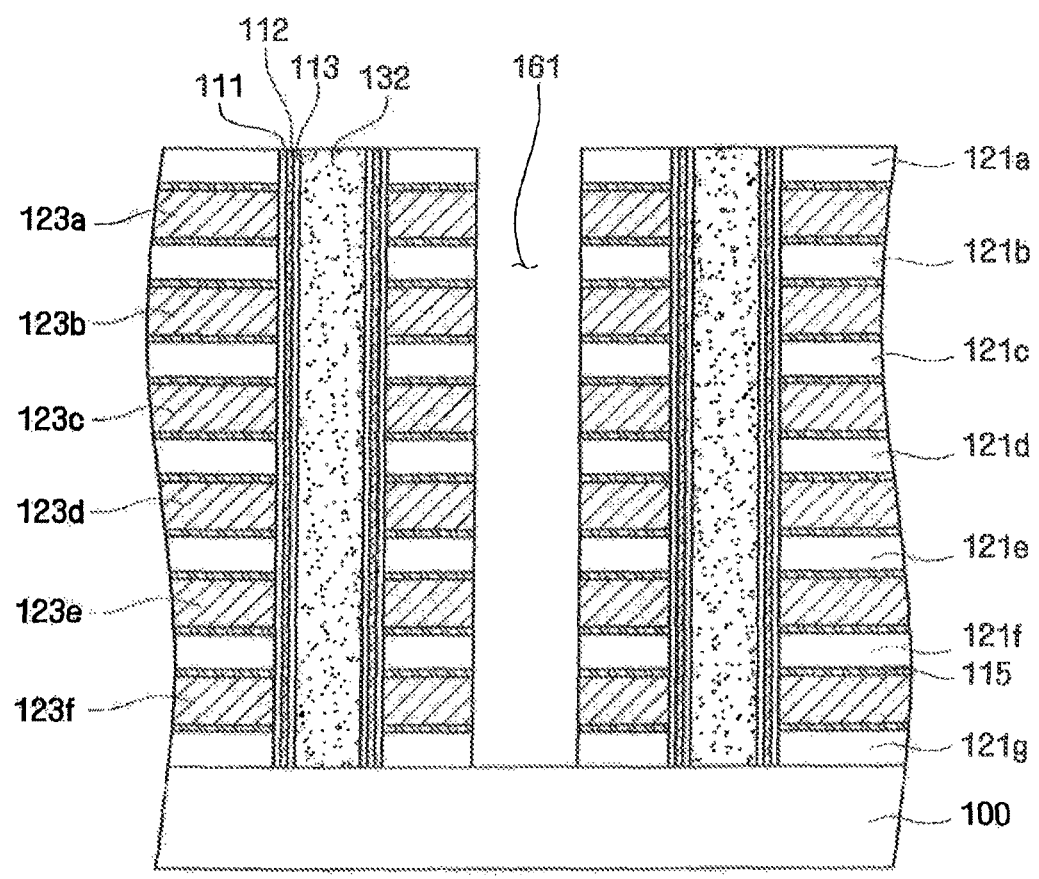

Next, referring to FIG. 7, an opening 161 is formed on the resultant structure illustrated in FIG. 6. Here, opening 161 may be formed to extend through the sacrificial layers 123a-123f, the interlayer dielectric layers 121a-121g, and the charge spread blocking layer 115. The opening 161 may be used as a path through which etchant to remove the sacrificial layers 123a-123f is injected.

Figure 8:
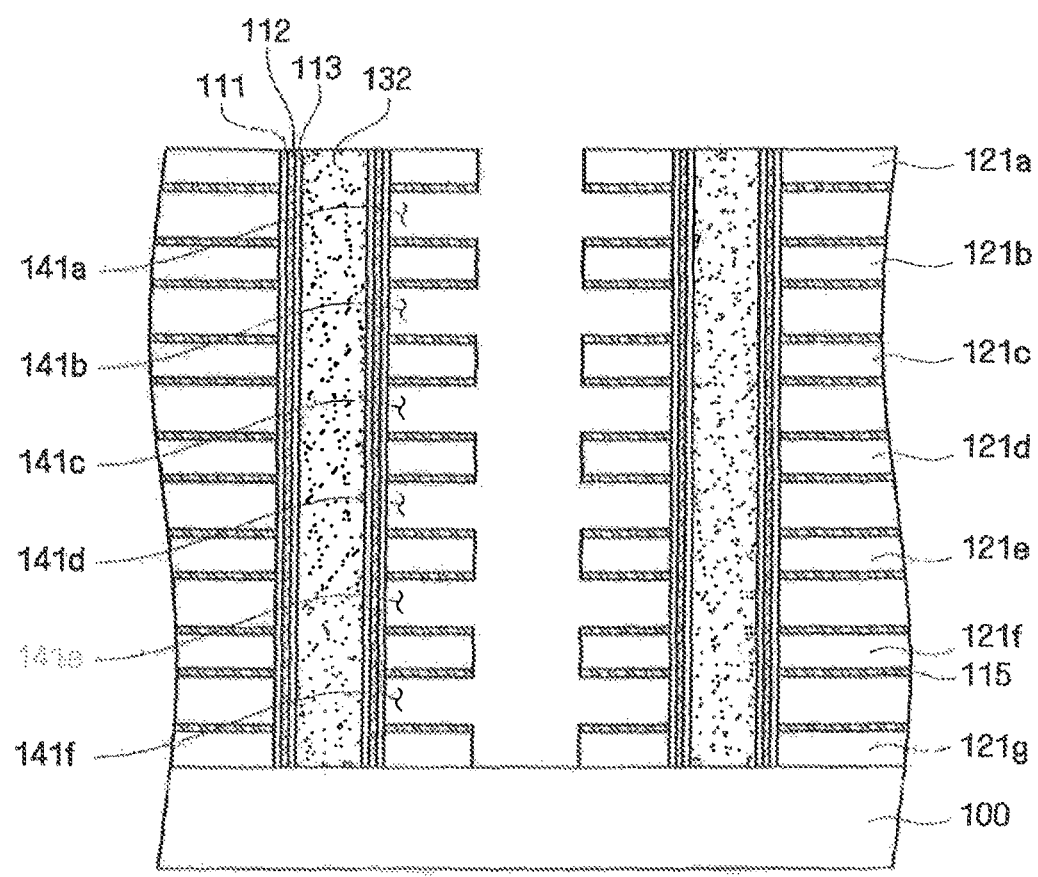

Next, referring to FIG. 8, the sacrificial layers 123a-123f whose sidewalls are exposed by the opening 161 are selectively removed to form a plurality of grooves 141a-141f between each of the interlayer dielectric layers 121a-121g. In order to remove sacrificial layers 123a-123f, the etchant is injected into the opening 161.

Figure 9:
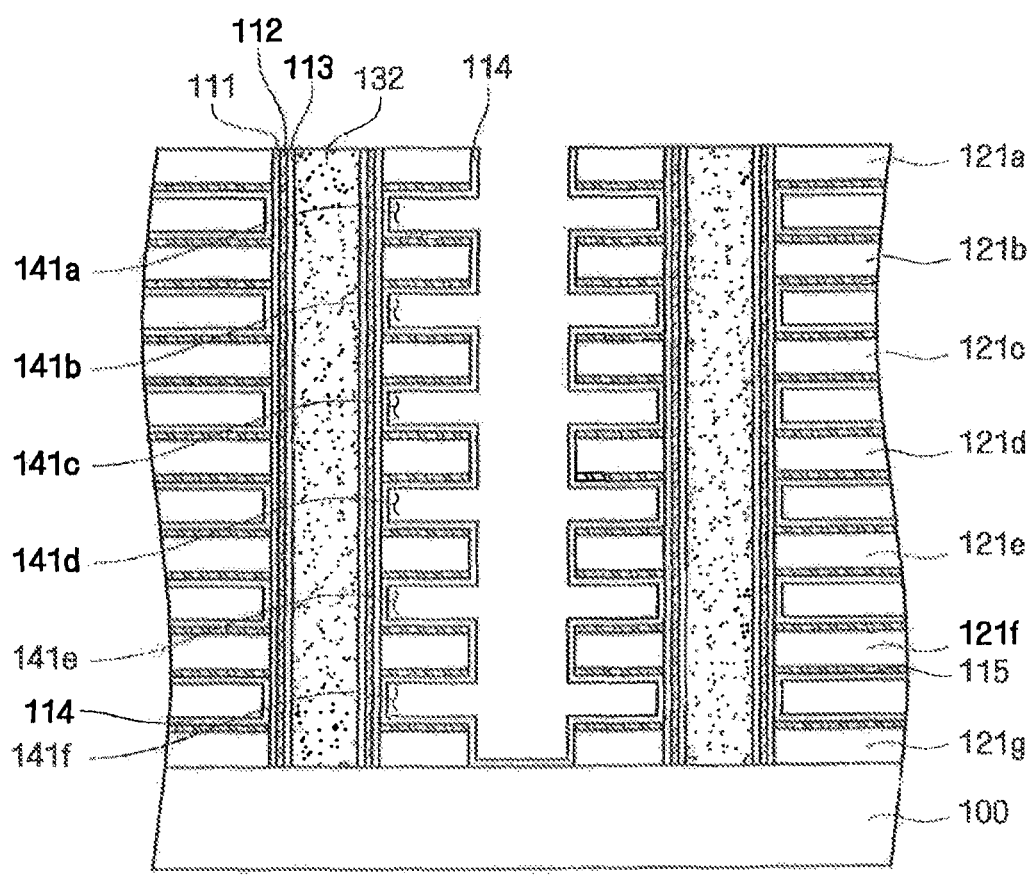

Next, referring to FIG. 9, a blocking insulation layer 114 is formed on the resultant structure illustrated in FIG. 8. The blocking insulation layer 114 may be conformably formed on the entire surface of the plurality of grooves 141a-141f and the interlayer dielectric layers 121a-121g. The blocking insulation layer 114 may be formed of an aluminum oxide layer or a dual layer including an aluminum oxide layer and a silicon oxide layer by chemical vapor deposition (CVD) or atomic layer deposition (ALD).

Figure 10:
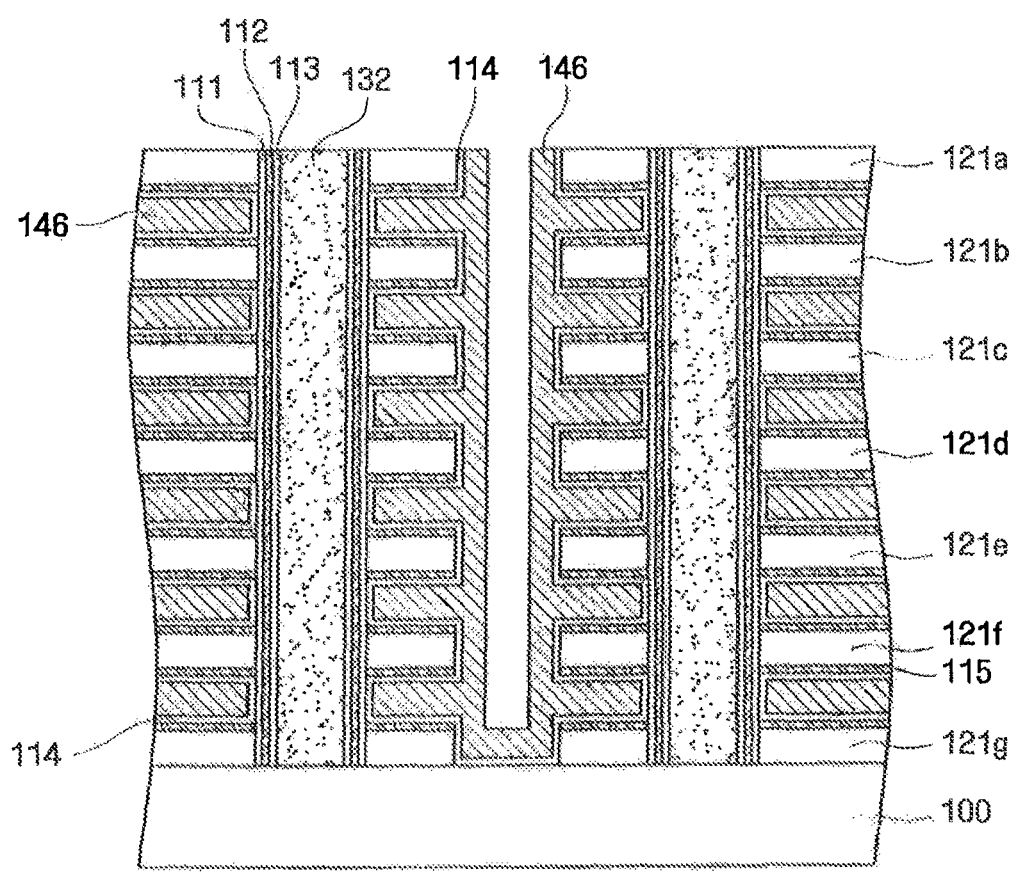

Next, referring to FIG. 10, the plurality of grooves 141a-141f having the blocking insulation layer 114 are filled with a conductive material, thereby forming a conductive layer 146. The conductive layer 146 may be formed of, for example, tungsten (W), by using chemical vapor deposition (CVD) or atomic layer deposition (ALD).

Figure 11:
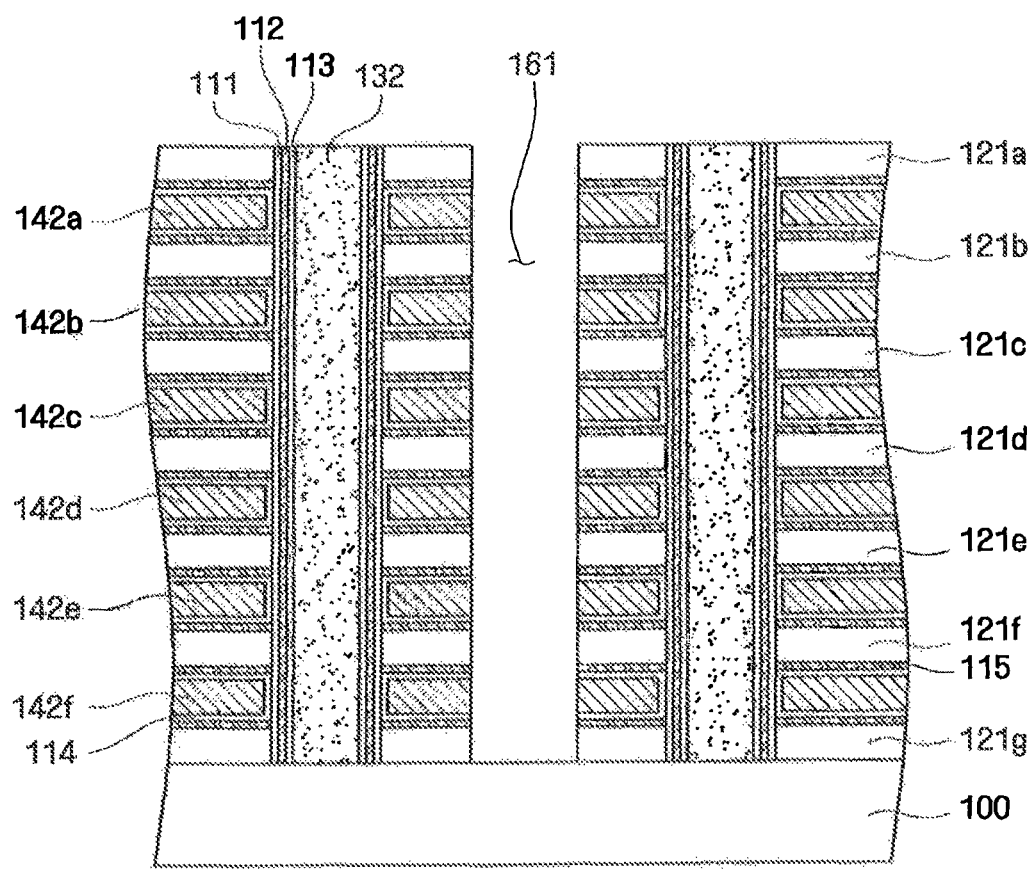

Next, referring to FIG. 11, portions of the conductive layer 146, excluding portions where the plurality of grooves 141a-141f are positioned, are removed, thereby forming a plurality of gate electrodes 142a-142f. When the conductive layer 146 is removed, the interlayer dielectric layer patterns 121a-121g and the blocking insulation layer 114 formed on sidewalls of the charge spread blocking layer 115 are also removed, thereby separating the blocking insulation layer 114 disposed on the various layers. Alternatively, the interlayer dielectric layer patterns 121a-121g and the blocking insulation layer 114 formed on sidewalls of the charge spread blocking layer 115 may be allowed to remain without being removed. In this case, the blocking insulation layer 114 disposed on the various layers may be connected to each other.

As a result of the process, a memory cell string, including serially connected cell transistors perpendicular to the substrate 100, is formed. Meanwhile, the plurality of gate electrodes 142a-142f may have horizontal plate shapes. Accordingly, a gate electrode included in a memory cell string and a gate electrode included in another memory cell string spaced apart from the memory cell string may be electrically connected to each other.

Figure 12:
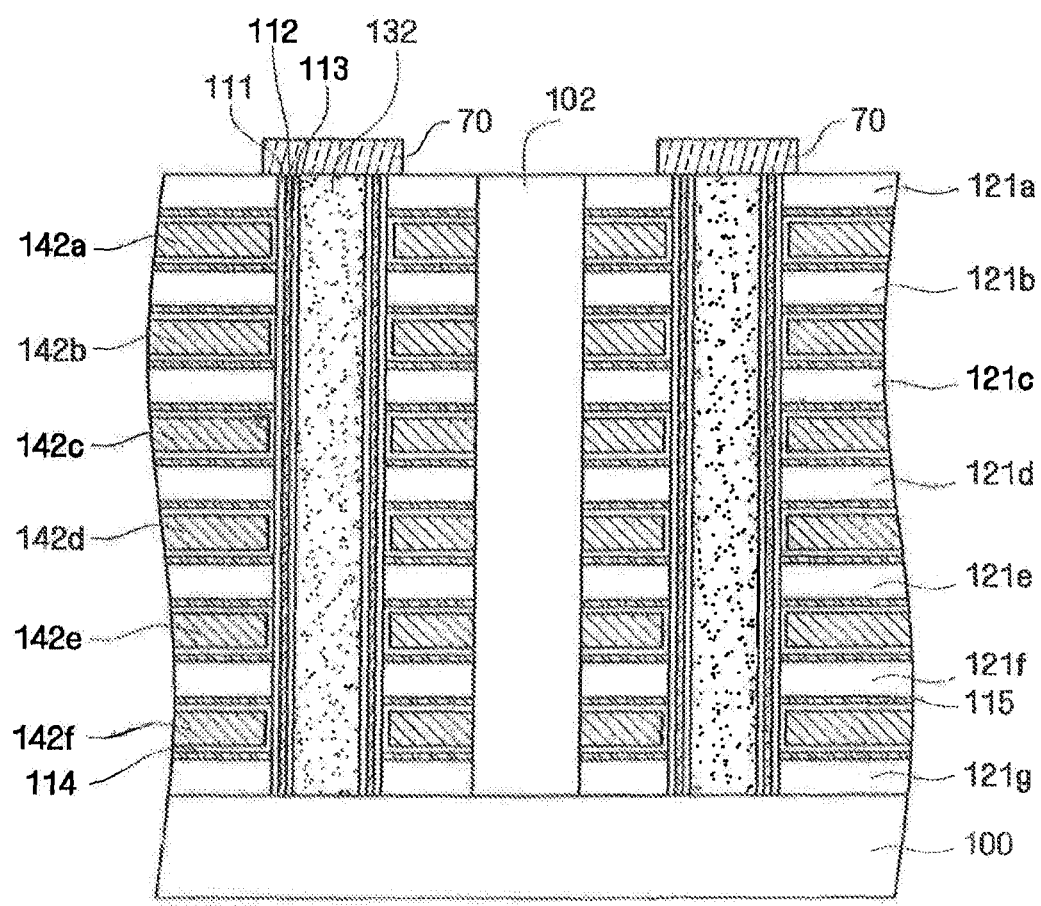

Next, referring to FIG. 12, pillar-shaped insulation layer patterns 102 may be formed to fill the opening 161. Next, bit lines 70 electrically connected to the semiconductor patterns 132 is formed, thereby completing the non-volatile memory device.

Figure 13:
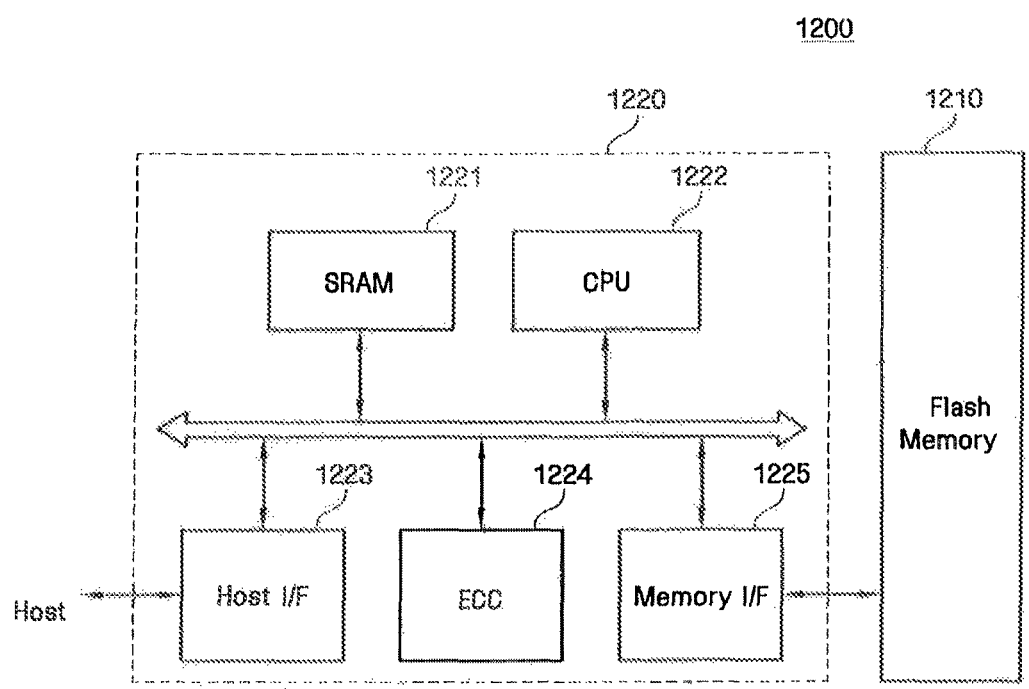
FIG. 13 is a block diagram illustrating a memory card including a non-volatile memory device according to embodiments of the present general inventive concept.
Figure 14:
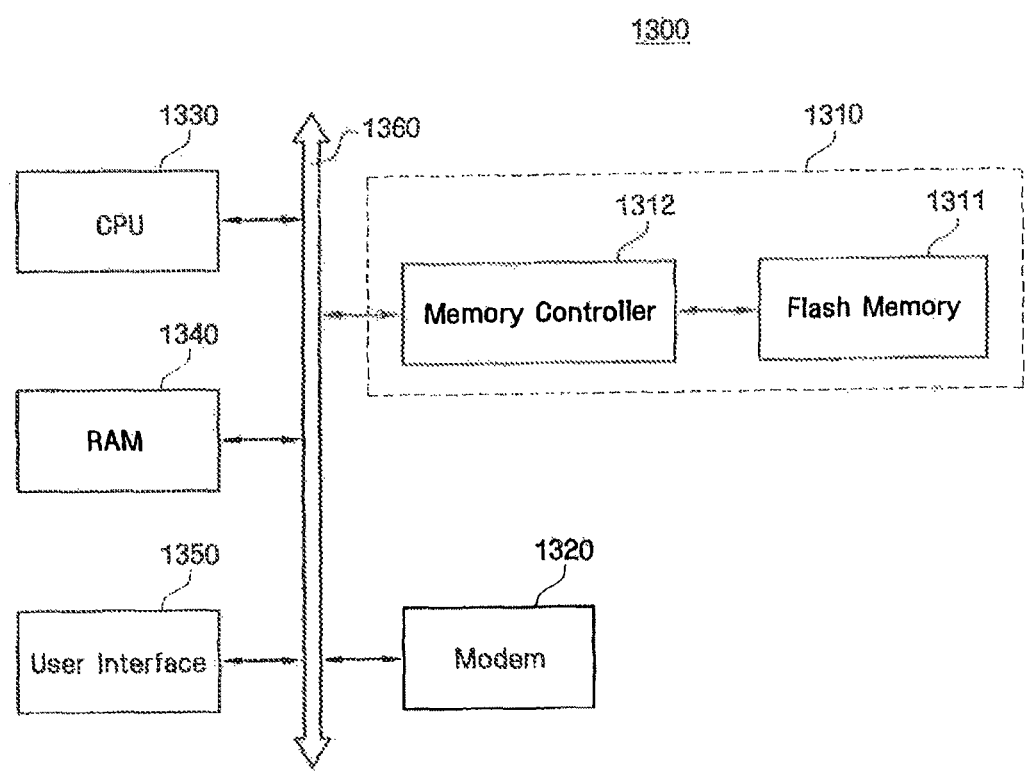
FIG. 14 is a block diagram illustrating an information processing system including a non-volatile memory device according to embodiments of the present general inventive concept.

Hereinafter, application examples of the non-volatile memory device according to the embodiments of the present general inventive concept will be described with reference to FIGS. 13 and 14. FIG. 13 is a block diagram illustrating a memory card including a non-volatile memory device according to embodiments of the present general inventive concept, and FIG. 14 is a block diagram illustrating an information processing system including a non-volatile memory device according to embodiments of the present general inventive concept.

Referring to FIG. 13, a memory card 1200 supports storage capacity of a large amount of data and includes a flash memory 1210. The flash memory 1210 may include the non-volatile memory device manufactured according to the embodiments of the present general inventive concept, for example, a NAND flash memory device.

The memory card 1200 may include a memory controller 1220 controlling data exchange between a host and the flash memory 1210.

A static random access memory (SRAM) 1221 is used as an operation memory of a central processing unit (CPU) 1222. A host interface 1223 includes a data exchange protocol of a host connected to the memory card 1200. An error correction code (ECC) 1224 detects and corrects an error included in data read from the flash memory 1210. A memory interface 1225 interfaces with the flash memory 1210. The CPU 1222 performs a controlling operation related to data exchange of the memory controller 1220. Although not illustrated, the memory card 1200 may further include an ROM (not illustrated) storing code data to interface to a host.

Referring to FIG. 14, the information processing system 1300 incorporating the non-volatile memory device according to the embodiments of the present general inventive concept may include a flash memory system 1310 including a flash memory device, for example, a NAND flash memory device. The information processing system 1300 may include a mobile device or a computer.

For example, the information processing system 1300 may include the flash memory system 1310, and a modem 1320, a central processing unit (CPU) 1330, a RAM 1340 and a user interface 1350, which are each connected to a system bus 1360. The flash memory system 1310 stores data processed by the CPU 1330 and data input from an external source.

The information processing system 1300 may be provided as a memory card, a solid state disk (SSD), a camera image sensor, and other application chipsets. For example, the flash memory system 1310 may constitute an SSD device. In this case, the information processing system 1300 can stably store a large amount of data in the flash memory system 1310.

The non-volatile memory device according to the embodiments of the present general inventive concept may be installed using various packaging manners. For example, the non-volatile device may be packaged and installed using a method such as package on package (PoP), ball grid arrays (BGAs), chip scale packages (CSPs), plastic leaded chip carrier (PLCC), plastic dual in-line package (PDIP), multi chip package (MCP), wafer-level fabricated package (WFP), wafer-level processed stack Package (WSP), die on waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flat pack (TQFP), system in package (SIP), or the like.

While the present general inventive concept has been particularly illustrated and described with reference to exemplary embodiments thereof, it will be understood by those of ordinary skill in the art that various changes in form and details may be made therein without departing from the spirit and scope of the present general inventive concept as defined by the following claims. It is therefore desired that the present embodiments be considered in all respects as illustrative and not restrictive, reference being made to the appended claims rather than the foregoing description to indicate the scope of the general inventive concept.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A non-volatile memory device comprising:
a substrate formed of a single crystalline semiconductor;
pillar-shaped semiconductor patterns extending perpendicular to the substrate;
a plurality of gate electrodes and a plurality of interlayer dielectric layers alternately stacked perpendicular to the substrate; and
a charge spread blocking layer formed between the plurality of gate electrodes and the plurality of interlayer dielectric layers; and
a tunnel insulation layer and a charge storage layer sequentially stacked on the surface of the sidewalls of the semiconductor patterns.

2. The non-volatile memory device of claim 1, wherein the charge spread blocking layer is formed of a metal nitride layer.

3. The non-volatile memory device of claim 2, wherein the charge spread blocking layer is formed of an aluminum nitride layer or an aluminum oxide layer.

4. The non-volatile memory device of claim 1, wherein the interlayer dielectric layers are formed of a silicon oxide layer or a silicon nitride layer.

5. The non-volatile memory device of claim 1, wherein the tunnel insulation layer and the charge storage layer are sequentially stacked on the entire surface of the sidewalls of the semiconductor patterns.

6. The non-volatile memory device of claim 5, wherein the tunnel insulation layer is formed of a silicon oxide layer or a dual layer including a silicon oxide layer and a silicon nitride layer.

7. The non-volatile memory device of claim 5, wherein the charge storage layer is formed of a nitride layer or a high-k layer.

8. The non-volatile memory device of claim 5, further comprising a capping layer formed on the entire surface of sidewalls of the charge storage layer between the gate electrodes and the charge storing layer.

9. The non-volatile memory device of claim 8, wherein the capping layer is formed of insulating metal oxide having a larger dielectric constant than the tunnel insulation layer.

10. The non-volatile memory device of claim 5, further comprising a blocking insulation layer between the gate electrodes and the charge spread blocking layer, the blocking insulation layer surrounding surfaces of the gate electrodes.

11. The non-volatile memory device of claim 10, wherein the blocking insulation layer is formed of an aluminum oxide layer or a dual layer including an aluminum oxide layer and a silicon oxide layer.

12. The non-volatile memory device of claim 1, further comprising bit lines contacting top surfaces of the semiconductor patterns and source/drain regions adjacent the bit lines.

13. The non-volatile memory device of claim 1, wherein the interlayer dielectric layers are directly contact with the charge spread blocking layer.

14. A non-volatile memory device including a plurality of memory cells on a semiconductor substrate, the memory cells comprising:
a plurality of gate electrodes connected in series and stacked perpendicular to the substrate;
a plurality of interlayer dielectric layers alternately stacked between each of the plurality of gate electrodes;
a plurality of pillar-shaped semiconductor patterns disposed adjacent to and extending along the stack gate electrodes; and
a charge storage layer positioned between the gate electrodes and the pillar-shaped semiconductor patterns to receive charges from the semiconductor patterns when voltage is applied to a gate electrode; and
a charge spread blocking layer extending perpendicular to the charge storage layer to electrically prevent leakage of the charges stored in the charge storage layer.

15. The memory device of claim 14, wherein the plurality of gate electrodes include an upper select gate electrode, a lower select gate electrode, and a plurality of control gate electrodes.

16. A method of forming a semiconductor device, comprising:
forming impurity regions of a first conductivity type in a semiconductor substrate;
alternatively stacking a plurality of interlayer dielectric layers and sacrificial dielectric layers in a direction perpendicular to the surface of the substrate;
forming a charge spread blocking layer on upper and lower surfaces of each of the sacrificial dielectric layers;
patterning and forming first pillar-shaped openings directly above the impurity regions to extend through the interlayer dielectric layers and sacrificial dielectric layers;
forming a plurality of charge storage layers on sides of the pillar-shaped openings;
forming pillar-shaped semiconductor patterns in the pillar-shaped openings;
removing the sacrificial dielectric layers to form grooves and filling the grooves with conductive material to form vertically stacked gate electrode patterns.

17. The method of claim 16, further comprising:
forming a second pillar-shaped opening between the plurality of impurity regions and first pillar-shaped semiconductor patterns to extend through the interlayer dielectric layers and sacrificial dielectric layers;
depositing the conductive material in the second pillar-shaped opening to form additional vertically stacked gate electrodes; and
filling the second pillar-shaped opening with an insulating material to isolate a first vertically stacked gate electrode pattern from a second vertically stacked gate electrode pattern.

18. The method of claim 16, further comprising:
forming a tunnel insulating layer between the charge storage layers and the semiconductor patterns; and
forming a capping insulating layer between the charge storage layers and the gate electrodes.

19. The method of claim 18, wherein the capping layers have a higher dielectric constant than the tunnel insulation layers and the charge storage layers have a higher dielectric constant than the capping layers.

* * * * *